United States Patent
Genz et al.

(10) Patent No.: US 7,171,639 B2
(45) Date of Patent: Jan. 30, 2007

(54) COMPARISON OF CIRCUIT LAYOUT DESIGNS

(75) Inventors: Lee D. Genz, Chandler, AZ (US); Andrew J. McRonald, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 343 days.

(21) Appl. No.: 10/802,774

(22) Filed: Mar. 18, 2004

(65) Prior Publication Data

US 2005/0210424 A1    Sep. 22, 2005

(51) Int. Cl.
    *G06F 17/50* (2006.01)
(52) U.S. Cl. .................... 716/5; 716/4; 716/6
(58) Field of Classification Search ............. 716/4–6
    See application file for complete search history.

(56) References Cited

U.S. PATENT DOCUMENTS

| | | | | |
|---|---|---|---|---|
| 5,404,310 A | * | 4/1995 | Mitsuhashi | 713/13 |
| 5,805,861 A | * | 9/1998 | Gilbert et al. | 703/15 |
| 6,369,606 B1 | * | 4/2002 | Houghton et al. | 326/36 |
| 6,650,953 B2 | * | 11/2003 | Schaffer et al. | 700/103 |
| 6,847,363 B1 | * | 1/2005 | Sauvageau | 345/443 |
| 6,952,688 B1 | * | 10/2005 | Goldman et al. | 706/45 |
| 2002/0032549 A1 | * | 3/2002 | Axelrod et al. | 703/2 |
| 2002/0187770 A1 | * | 12/2002 | Grover et al. | 455/403 |
| 2004/0204925 A1 | * | 10/2004 | Alon et al. | 703/2 |
| 2005/0063373 A1 | * | 3/2005 | DeHon et al. | 370/380 |
| 2005/0143966 A1 | * | 6/2005 | McGaughy | 703/3 |

\* cited by examiner

*Primary Examiner*—Thuan Do
*Assistant Examiner*—Naum B. Levin
(74) *Attorney, Agent, or Firm*—Venable LLP; James R. Burdett; Michael A. Sartori

(57) ABSTRACT

A first circuit layout design is obtained, and a second circuit layout design is obtained. A first topology graph is generated for the first circuit layout design, and a second topology graph is generated for the second circuit layout design. The first topology graph and the second topology graph are compared to obtain a comparison result. The comparison result is reported.

32 Claims, 6 Drawing Sheets

COMPARISON OF CIRCUIT LAYOUT DESIGNS

BACKGROUND

1. Field of the Invention

The invention relates to a comparison of circuit layout designs.

2. Background of the Invention

To determine differences between two circuit layout designs, the two circuit layout designs are examined manually, even if the circuit layout designs are generated with electronic design automation software. Manual examination of circuit layout designs is time consuming, leads to non-repeatable comparison results, and results in difficulty in tracking changes of circuit layout designs through design iterations.

BRIEF SUMMARY OF THE INVENTION

With the invention, a first circuit layout design is obtained, and a second circuit layout design is obtained. A first topology graph is generated for the first circuit layout design, and a second topology graph is generated for the second circuit layout design. The first topology graph and the second topology graph are compared to obtain a comparison result. The comparison result is reported.

BRIEF DESCRIPTION OF THE DRAWINGS

The invention may be understood by referring to the following description and accompanying drawings that are used to illustrate embodiments of the invention, where the same reference numerals refer to the same features. In the drawings.

DETAILED DESCRIPTION OF THE INVENTION

Figure 1:
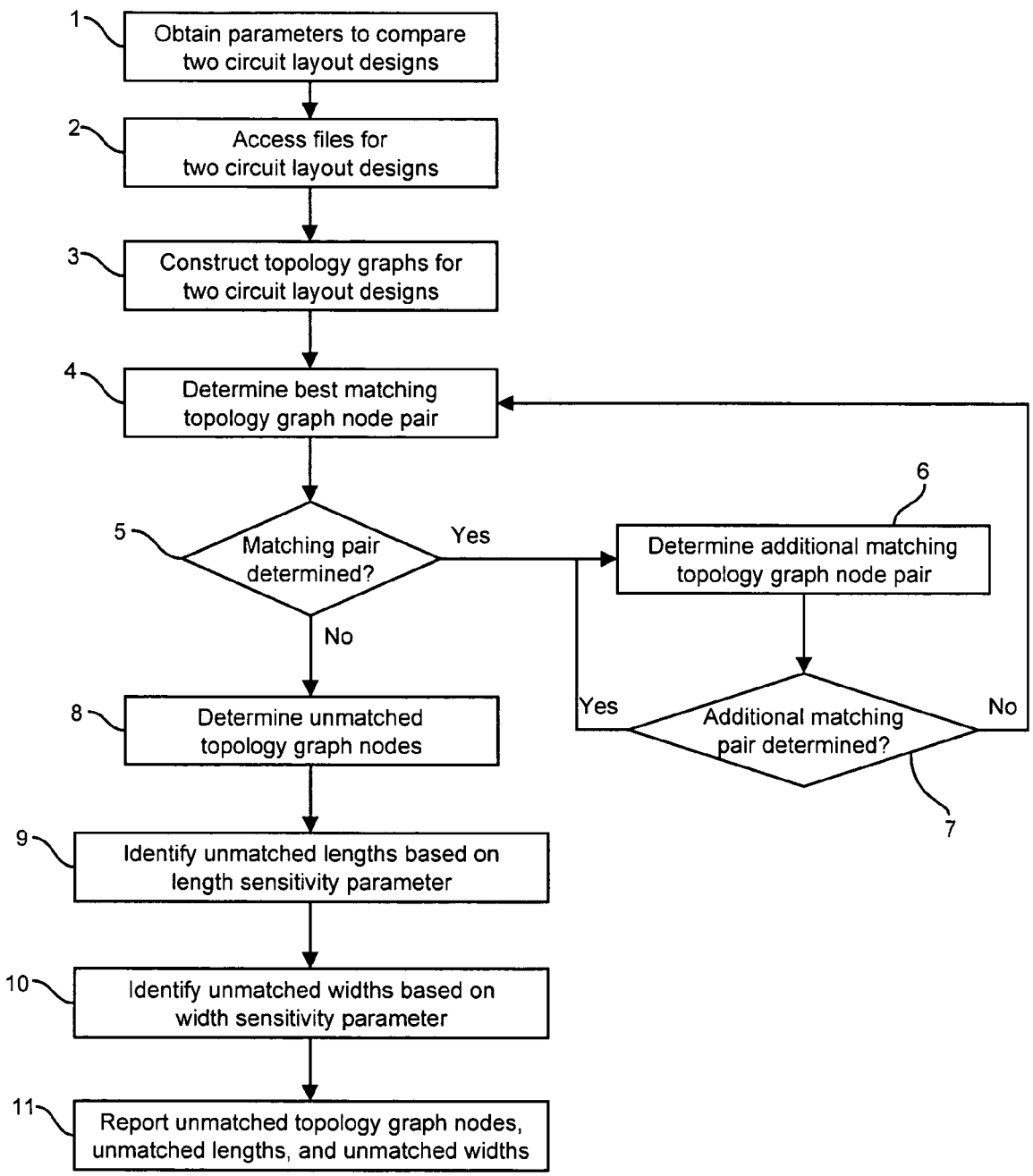
FIG. 1 shows a flow diagram for comparing circuit layout designs for an exemplary embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment," "an embodiment," "example embodiment," "exemplary embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

According to some embodiments of the invention, an algorithm may be considered to be a self-consistent sequence of acts or operations leading to a desired result. These may include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

According to some embodiments of the invention, unless specifically stated otherwise, as apparent from the following discussions, it is appreciated that discussions utilizing terms such as "processing," "computing," "calculating," "determining," or the like, may refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In some embodiments, the term "processor" may refer to any device or portion of a device that processes electronic data from registers and/or memory to transform that electronic data into other electronic data that may be stored in registers and/or memory. A "computing platform" may comprise one or more processors.

Embodiments of the present invention may include apparatuses for performing the operations herein. An apparatus may be specially constructed for the desired purposes, or it may comprise a general purpose device selectively activated or reconfigured by a program stored in the device.

Embodiments of the invention may be implemented in one or a combination of hardware, firmware, and software. Embodiments of the invention may also be implemented as instructions stored on a machine-accessible medium, which may be read and executed by a computing platform to perform the operations described herein. A machine-accessible medium may include any mechanism for storing or transmitting information in a form readable by a machine (e.g., a computer). For example, a machine-accessible medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

FIG. 1 shows a flow diagram for comparing circuit layout designs for an exemplary embodiment of the invention.

In block 1, parameters for comparing two circuit layout designs may be obtained from a user, other software, or default settings. For example, a first file path name of a first circuit layout design and a second file path name of a second circuit layout design may be obtained. Further, for example, at least one sensitivity parameter may be obtained, such as a width sensitivity parameter and/or a length sensitivity parameter. The width sensitivity parameter may identify a minimum amount that a line may change in width before it may be flagged as a difference. The length sensitivity parameter may identify a minimum amount that a line may change in length before it may be flagged as a difference.

In block 2, circuit layout design files may be accessed for the two circuit layout designs. A first circuit layout design file may be accessed for the first circuit layout design based on the first file path name from block 1, and a second circuit layout design file may be accessed for the second circuit layout design based on the second file path name from block 1.

Figure 2:
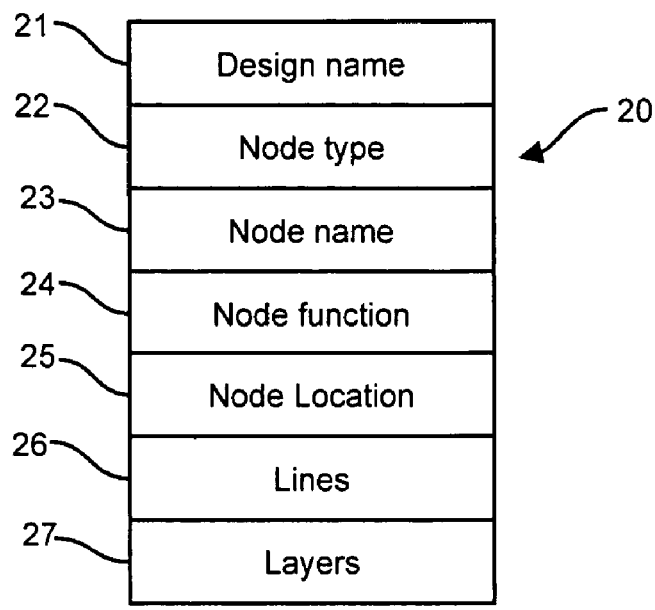
FIG. 2 shows an exemplary data structure for a topology graph node.

In block 3, topology graphs may be constructed for the two circuit layout designs. A first topology graph may be constructed based on the first circuit layout design file from block 2, and a second topology graph may be constructed based on the second circuit layout design file from block 2. Each topology graph may identify the nodes and the physical trace segment routing that make up the network topology of a circuit layout design. Each topology graph may include data structures, such as topology graph nodes and topology graph lines. Hence, the first topology graph may include first topology graph nodes and first topology graph lines, and the second topology graph may include second topology graph nodes and second topology graph lines. FIG. 2, discussed below, shows an exemplary data structure for a topology graph node, and FIG. 3, discussed below, shows an exemplary data structure for a topology graph line.

Figure 4:
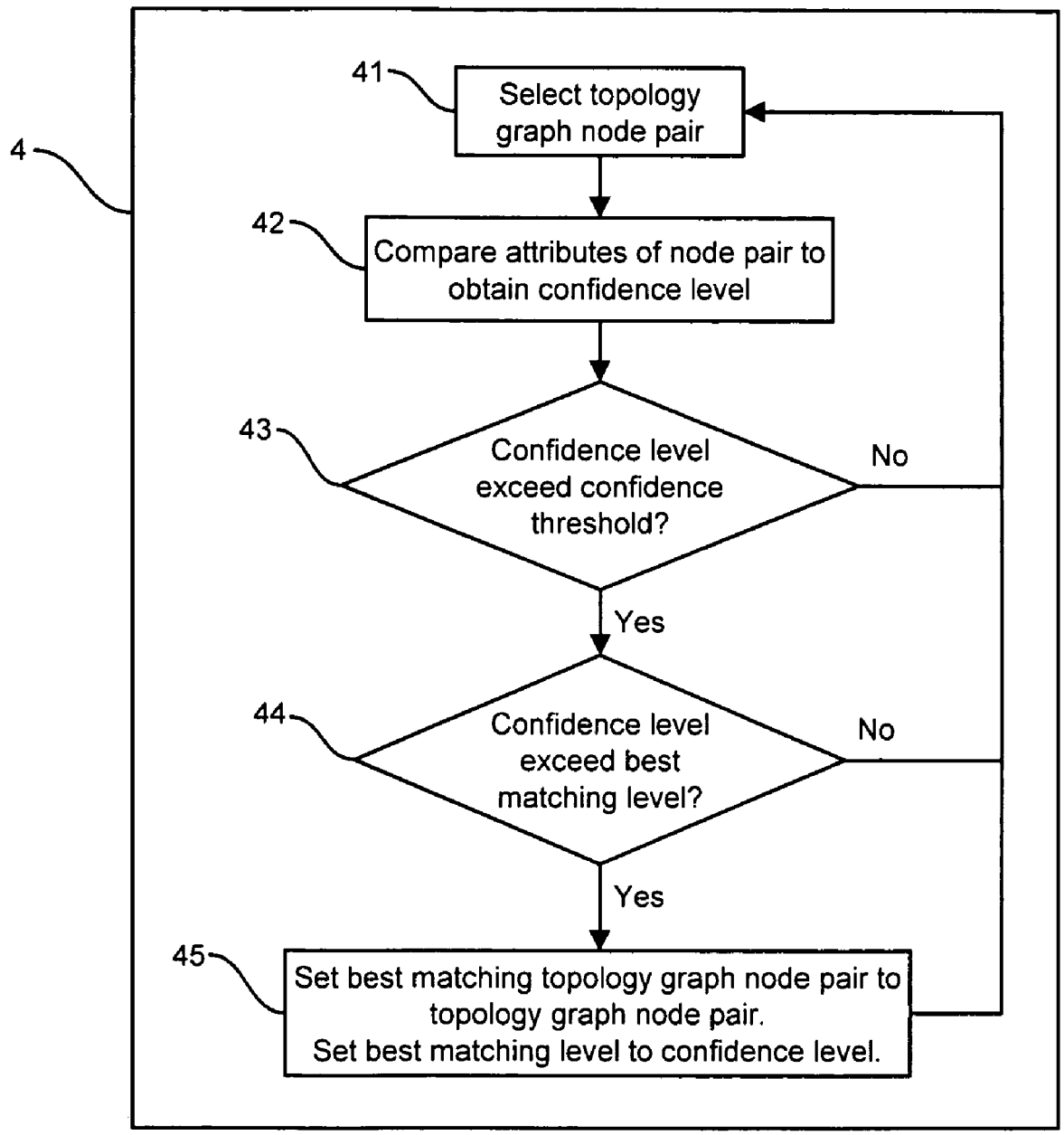
FIG. 4 shows a flow diagram for determining a best topology graph node pair for an exemplary embodiment of the invention.

In block 4, a best matching topology graph node pair may be determined. The best matching topology graph node pair may be determined based on comparing the first topology graph nodes and the first topology graph lines for the first topology graph with the second topology graph nodes and the second topology graph lines for the second topology graph. Various combinations, such as some or all combinations, of matching pairs of topology graph nodes may be compared before a best matching topology graph node pair may be determined. FIG. 4, discussed below, shows a flow diagram for determining a best matching topology graph node pair for an exemplary embodiment of the invention.

In block 5, a decision may be made whether a matching pair of topology graph nodes was determined in block 4. If a matching pair of topology graph nodes was determined, flow may proceed to block 6; otherwise, flow may proceed to block 8.

Figure 5:
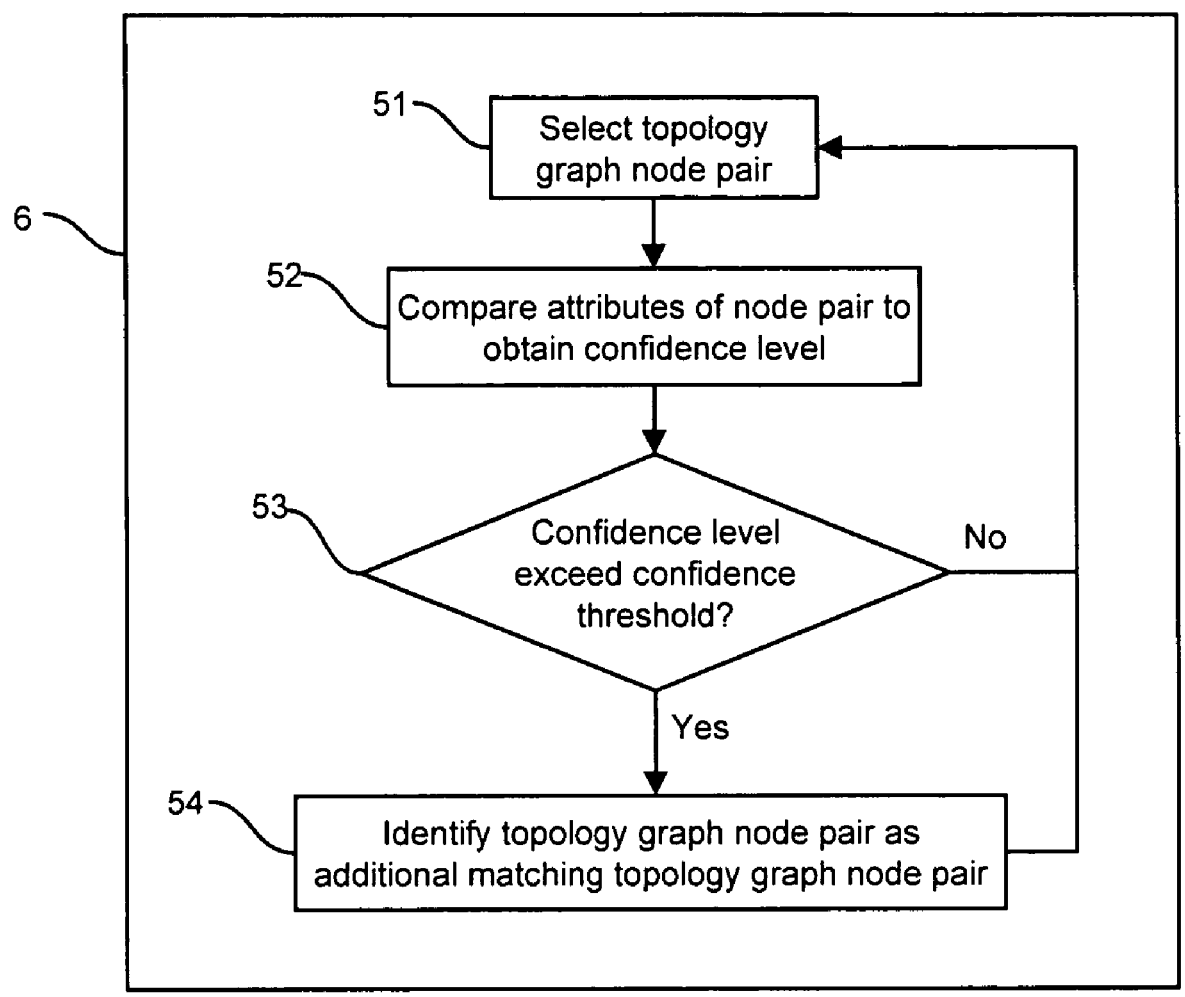
FIG. 5 shows a flow diagram for determining an additional matching topology graph node pair for an exemplary embodiment of the invention.

In block 6, an additional matching pair of topology graph nodes may be determined. The additional matching pair may be determined by traversing (or walking) the first and second topology graphs beginning with the first and second topology graph nodes, respectively, of the best matching topology graph node pair determined in block 4 to nodes connected (or more generally coupled) thereto until an additional matching pair of topology graph nodes is determined. Once an additional matching pair of topology graph nodes is determined, or once an additional matching pair of topology graph nodes can not be determined after examining nodes connected (or more generally coupled) to the first and second topology graph nodes of the best matching topology graph node pair, flow may proceed to block 7. FIG. 5, discussed below, shows a flow diagram for determining an additional matching pair of topology graph nodes for an exemplary embodiment of the invention.

In block 7, a decision may be made whether an additional matching pair of topology graph nodes was determined in block 6. If an additional matching pair of topology graph nodes was determined, flow may proceed back to block 6 to determine yet another additional matching pair of topology graph nodes; otherwise, flow may proceed to block 4. If flow proceeds back to block 6, the traversing (or walking) of the first and second topology graphs may begin with the first and second topology graph nodes, respectively, of the additional matching pair determined previously in block 6. If flow proceeds back to block 4, the best matching pair of topology graph nodes may be determined from the topology graph nodes left unmatched after blocks 5, 6, and 7.

In block 8, the first topology graph nodes of the first topology graph that are unmatched to second topology graph nodes of the second topology graph may be identified as unmatched first topology graph nodes, and the second topology graph nodes of the second topology graph that are unmatched to first topology graph nodes of the first topology graph may be identified as unmatched second topology graph nodes.

Figure 8:
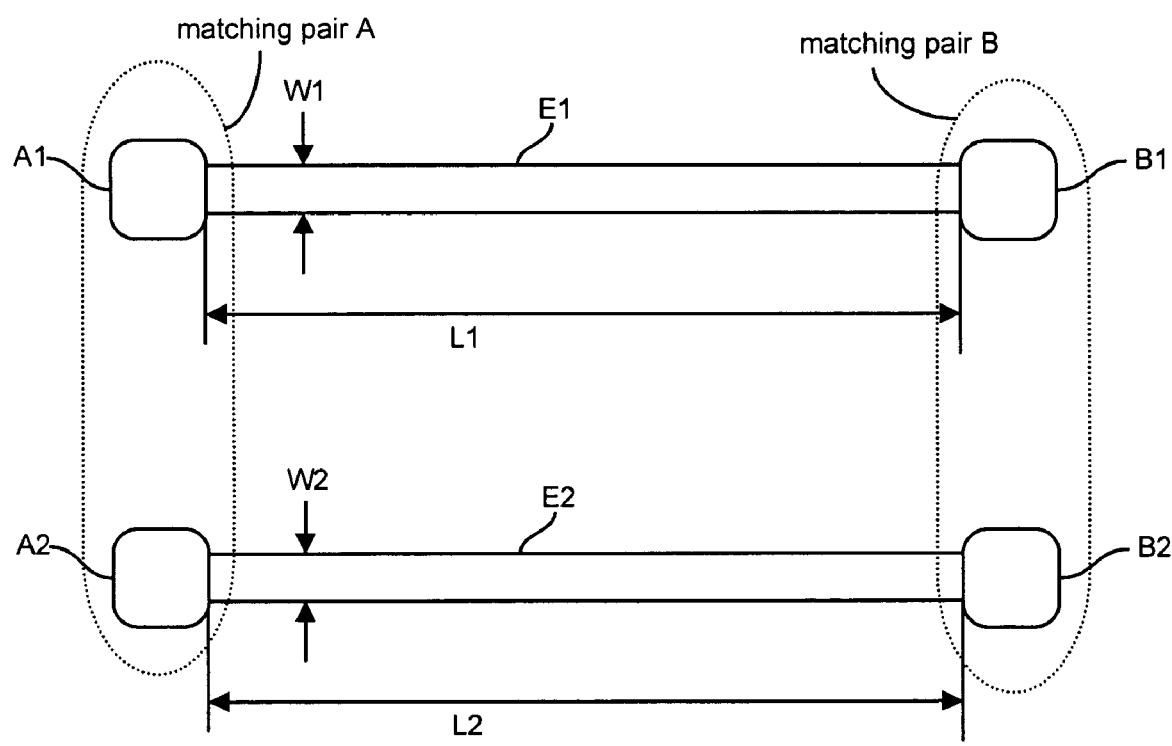
FIG. 8 shows two matching pairs of topology graph nodes for an exemplary embodiment of the invention.

In block 9, the lengths (or distance) between connected topology graph nodes of the matching pairs from blocks 4 and 6 may be determined, and unmatched lengths based on the length sensitivity parameter from block 1 may be identified. As an example, FIG. 8 shows two matching pairs of topology graph nodes. A matching pair A may include a first topology graph node A1 and a second topology graph node A2, and a matching pair B may include a first topology graph node B1 and a second topology graph node B2. First topology graph node A1 may be connected to first topology graph node B1 via first topology graph line E1, and second topology graph node A2 may be connected to second topology graph node B2 via second topology graph line E2. First topology graph line E1 may include a length L1, and second topology graph line E2 may include a length L2. If the difference between length L1 and length L2 exceeds a length sensitivity parameter $S_L$ (e.g., $|L1-L2|>S_L$), the length L1 of the first topology graph line E1 may be identified as an unmatched length, and the length L2 of the second topology graph line E2 may also be identified as an unmatched length.

In block 10, the widths between connected topology graph nodes of the matching pairs from blocks 4 and 6 may be determined, and unmatched widths based on the width sensitivity parameter from block 1 may be identified. Continuing the example from block 9 shown in FIG. 8, first topology graph line E1 may include a width W1, and second topology graph line E2 may include a width W2. If the difference between width W1 and width W2 exceeds a width sensitivity parameter $S_W$ (e.g., $|W1-W2|>S_W$), the width W1 of the first topology graph line E1 may be identified as an unmatched width, and the width W2 of the second topology graph line E2 may also be identified as an unmatched width.

In block 11, the unmatched first topology graph nodes from block 8, the unmatched second topology graph nodes from block 8, the unmatched lengths from block 9, and the unmatched widths from block 10 may be reported. This information may be reported in any useful manner. Examples of reporting this information may include: a displayed message; a saved file; and an email message.

As an option, blocks 9 and 10 may be replaced or augmented with the addition of checking for other sensitivity parameters that may be obtained from block 1. Block 11 may be modified accordingly to report results from comparisons made with the other sensitivity parameters that may be obtained from block 1.

FIG. 2 shows an exemplary data structure 20 for a topology graph node. The exemplary data structure 20 may be used for each first topology graph node and each second topology graph node. The exemplary data structure 20 may include several fields, such as design name 21, node type 22, node name 23, node function 24, node location 25, lines 26, and layers 27. As additional parameters and/or other parameters are used to compare the circuit layout designs, corresponding fields may be included with and/or swapped for, respectively, the exemplary fields shown in FIG. 2.

The design name 21 may identify the circuit layout design file from block 2 in which the topology graph node is located.

The node type 22 may identify the type of node. Examples of node types may include: pin; stub; via; shape; bridge; T-node; and width-change. A pin node type may refer to a node where a pin may be located. A stub node type may refer to a node where a trace segment terminates in a dead-end (e.g., no node type other than possibly a via). A via node type may refer to a node where a connection occurs between at least two layers. A shape node type may refer to a node having a shape other than a trace segment. Such a shape may have parameters associated with geometry, length, and width and may be generally larger than a trace segment. A bridge node type may refer to a node without a physical correlation to the circuit layout and may connect two trace segments. A T-node node type may refer to a node where three or more segments meet. A width-change node type may refer to a node where the width of a trace segment changes.

The node name 23 may identify the name of the node given in the circuit layout. The name of the node may be so-called reference descriptor ("refdes") prefix information.

The node function 24 may identify the function the node performs. For example, the function may be a resistor, a capacitor, an inductor, a diode, a transistor, a logic operation, a logic device, a circuit operation, a circuit element, or a particular chip.

The node location 25 may identify the location of the topology graph node on the circuit layout. The location may be provided as Cartesian coordinates on the circuit layout.

The lines 26 may identify any topology graph lines connected to the topology graph node. The lines 26 may identify specific data structures for topology graph lines as discussed below for FIG. 3.

The layers 27 may identify the layers of the circuit layout design on which the topology graph node exists. The topology graph node may exist on one or more layers of the circuit layout.

Figure 3:
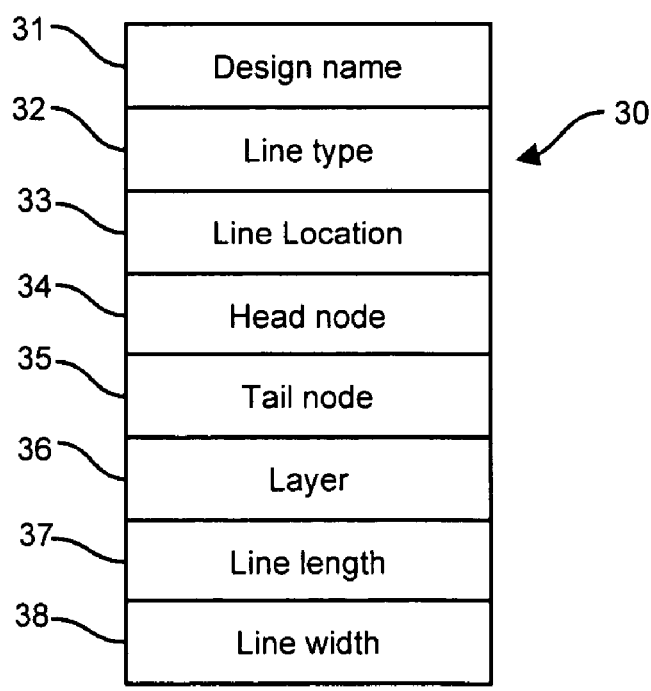
FIG. 3 shows an exemplary data structure for a topology graph line.

FIG. 3 shows a data structure for a topology graph line. The exemplary data structure 30 may be used for each first topology graph line and each second topology graph line. The exemplary data structure 30 may include several fields, such as design name 31, line type 32, line location 33, head node 34, tail node 35, layer 36, line length 37, and line width 38. As additional parameters and/or other parameters are used to compare the circuit layout designs, corresponding fields may be included with and/or swapped for, respectively, the exemplary fields shown in FIG. 3.

The design name 31 may identify the circuit layout design file from block 2 in which topology graph the line is located.

The line type 32 may identify the type of line. Examples of line types may include: regular; and zero. A regular line type may refer to any type of trace segment connected to one or more topology graph nodes. A zero line type may refer to a point on the circuit layout (e.g., a line having a zero length and a zero width). The zero line type may not have a physical correlation to the circuit layout.

The line location 33 may identify the location of the topology graph line on the circuit layout. The location may be provided as Cartesian coordinates on the circuit layout.

The head node 34 may identify the topology graph node at one end of the topology graph line.

The tail node 35 may identify the topology graph node at the other end of the topology graph line.

The layer 36 may identify the layer of the circuit layout on which the topology graph line exists.

The line length 37 may identify the length of the topology graph line.

The line width 38 may identify the width of the topology graph line.

Continuing the example discussed for blocks 9 and 10 above and as shown in FIG. 8 to illustrate the data structures shown in FIGS. 2 and 3, the data structure for the first topology graph node A1 may include a field (e.g., lines 26) identifying line E1, and the data structure for the second topology graph node B1 may include a field (e.g., lines 26 in FIG. 2) identifying line E1. The data structure for the first topology graph line E1 may include a field (e.g., head node 34) identifying first topology graph node A1, a field (e.g., tail node 35) identifying second topology graph node B1, a field (e.g., line length 37) identifying length L1, and a field (e.g., line width 38) identifying width W1. Similar data structures may exist for the first topology graph node A2, the second topology graph node B2, and the second topology graph line E2.

FIG. 4 shows a flow diagram for block 4 of FIG. 1 for determining a best matching topology graph node pair for an exemplary embodiment of the invention.

In block 41, a topology graph node pair may be selected. One first topology graph node from the first topology graph and one second topology graph node from the second topology graph may be selected as the topology graph node pair. The topology graph node pair may be selected based on any selection technique. For example, a brute force approach or a heuristic approach may be employed.

In block 42, attributes of each topology graph node in the topology graph node pair may be compared to obtain a confidence level. The attributes for comparison may be any of the data stored in the data structures of the topology graph nodes and topology graph lines. For example, the attributes used for comparison may include: node type 22, node function 24, node location 25, connecting topology graph nodes identified by lines 26, and/or layers 27. To identify connecting topology graph nodes identified by lines 26, the following attributes may be used from the topology graph lines identified by lines 26: line type 32, line location 33, head node 34, and tail node 35. The confidence level may be obtained from a comparison of the attributes.

In block 43, the confidence level from block 42 may be compared to a confidence threshold. If the confidence level exceeds the confidence threshold, the two topology graph nodes in the topology graph node pair may be sufficiently similar to be considered a match, and flow may proceed to block 44. Otherwise, if the confidence level does not exceed the confidence threshold, the two topology graph nodes in the topology graph node pair may not be sufficiently similar to be considered a match, and flow may return to block 41, where another topology graph node pair may be selected.

In block 44, the confidence level from block 42 may be compared to a best confidence level. The best confidence level may be associated with a topology graph node pair identified as the best matching topology graph node pair thus far. For the initial loop through FIG. 4, the best confidence level may be predetermined. If the confidence level exceeds the best confidence level, the topology graph node pair from block 2 may be considered to be the best matching topology graph node pair thus far, and flow may proceed to block 45. Otherwise, if the confidence level does not exceed the best confidence level, the topology graph node pair from block 2 may not be considered to be the best matching topology graph node pair thus far, and flow may return to block 41, where another topology graph node pair may be selected.

In block 45, the best matching topology graph node pair may be set to the topology graph node pair from block 41, and the best confidence level may be set to the confidence level from block 42. Flow may return to block 41, where another topology graph node pair may be selected.

In returning to block 41 from block 43, 44, or 45, another topology graph node pair may be selected based on any selection technique. For example, a brute force approach or a heuristic approach may be employed and may continue from the topology graph node pair selected previously in block 41.

FIG. 5 shows a flow diagram for block 6 of FIG. 1 for determining an additional matching pair of topology graph nodes for an exemplary embodiment of the invention.

In block 51, a topology graph node pair may be selected. One first topology graph node from the first topology graph and one second topology graph node from the second topology graph may be selected as the topology graph node pair. The selected first topology graph node may be connected (or more generally coupled) to the first topology graph node of the best matching topology graph node pair from block 4, and the selected second topology graph node may be connected (or more generally coupled) to the second topology graph node of the best matching topology graph node pair from block 4. The topology graph node pair may be selected based on any selection technique. For example, a brute force approach or a heuristic approach may be employed.

Blocks 52 and 53 may be identical to blocks 42 and 43 in FIG. 4, respectively.

In block 54, the topology graph node pair from block 51 may be identified as the additional matching pair.

In returning to block 51 from block 53 or 54, another topology graph node pair may be selected based on any selection technique. For example, a brute force approach or a heuristic approach may be employed and may continue from the topology graph node pair selected previously in block 51.

Figure 6:
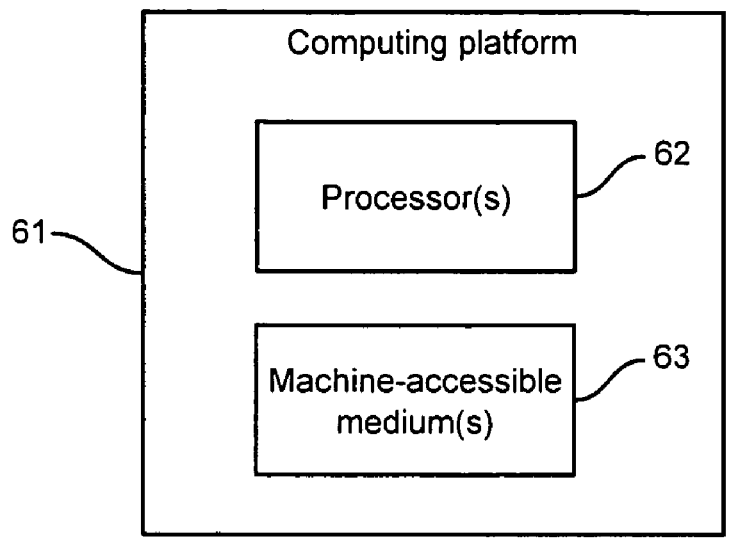
FIG. 6 shows an apparatus for an exemplary embodiment of the invention.

FIG. 6 shows an apparatus for an exemplary embodiment of the invention. A computing platform 61 may include one or more processors 62 and one or more machine-accessible medium 63. The invention described herein may be implemented as instructions stored on the one or more machine-accessible medium 63, which may be read and executed by the computing platform 61 and/or the one ore more processors 62 to perform the operations for the invention described herein.

Figure 7:
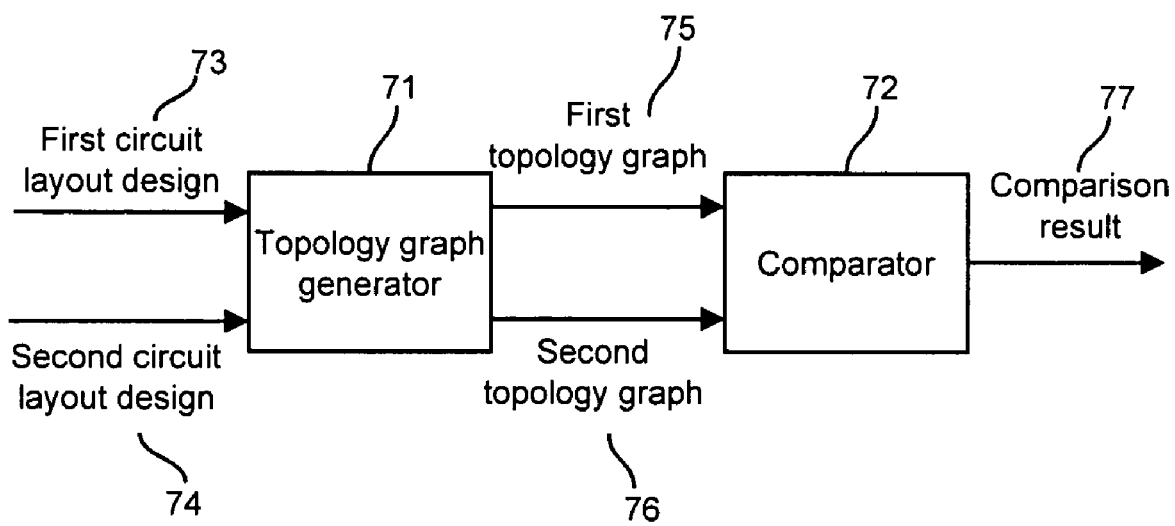
FIG. 7 shows an apparatus for an exemplary embodiment of the invention.

FIG. 7 shows an apparatus for an exemplary embodiment of the invention. The apparatus may include a topology graph generator 71 and a comparator 72. The topology graph generator 71 may receive a first circuit layout design 73 and a second circuit layout design 74 and may produce a first topology graph 75 for the first circuit layout design 73 and a second topology graph 76 for the first circuit layout design 74, respectively. The comparator 72 may receive the first topology graph 75 and the second topology graph 76 and may compare the two topology graphs 75, 76 to obtain a comparison result 77. The comparison result 77 may be reported. The topology graph generator 71 may be implemented with specific hardware and/or circuitry to implement the invention. The comparator 72 may be implemented with specific hardware and/or circuitry to implement the invention.

In the above exemplary embodiments, the circuit layout design may refer to any type of circuit layout design. For example, the circuit layout design may be for a printed circuit board design or for a semiconductor chip design.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. A machine-accessible medium that provides instructions, which when executed by a computing platform, cause said computing platform to perform operations comprising a method of:
   obtaining a first circuit layout design;
   obtaining a second circuit layout design;
   generating a first topology graph for said first circuit layout design;
   generating a second topology graph for said second circuit layout design;
   comparing said first topology graph and said second topology graph to obtain a comparison result, wherein said comparison result comprises at least a first matched topology graph node pair and a second matched topology graph node pair connected via a topology graph line pair, said topology graph line pair having a pair of lengths and a pair of widths, wherein said method further comprises:
   comparing said pair of lengths to a length sensitivity parameter; and
   comparing said pair of widths to a width sensitivity parameter; and reporting said comparison result.

2. A machine-accessible medium as in claim 1, wherein said first topology graph comprises a plurality of first topology graph nodes and a plurality of first topology graph lines, and wherein said second topology graph comprises a plurality of second topology graph nodes and a plurality of second topology graph lines.

3. A machine-accessible medium as in claim 2, wherein each first topology graph node comprises a data structure identifying at least one selected from the group consisting of: a node type for the first topology graph node, a node function for the first topology graph node, a node location for the first topology graph node, first topology graph lines connected to the first topology graph node, and at least one layer for the first topology graph,
   wherein each first topology graph line comprises a data structure identifying at least one selected from the group consisting of: a line type for the first topology graph line, a line location for the first topology graph line, a head node for the first topology graph line, a tail node for the first topology graph line, a layer for the first topology graph line, a line length for the first topology graph line, and a line width for the first topology graph line,
   wherein each second topology graph node comprises a data structure identifying at least one selected from the group consisting of: a node type for the second topology graph node, a node function for the second topology graph node, a node location for the second topology graph node, second topology graph lines connected to the second topology graph node, and at least one layer for the second topology graph, and wherein each second topology graph line comprises a data structure identifying at least one selected from the group consisting of: a line type for the second topology graph line, a line location for the second topology graph line, a head node for the second topology graph line, a tail node for the second topology graph line, a layer for the second topology graph line, a line length for the second topology graph line, and a line width for the second topology graph line.

4. A machine-accessible medium as in claim 1, wherein said comparing comprises determining a best matching topology graph node pair from said first topology graph and said second topology graph.

5. A machine-accessible medium as in claim 4, wherein said determining said best matching topology graph node pair comprises:

selecting a first topology graph node from said first topology graph and a second topology graph node from said second topology graph to obtain a topology graph node pair;

comparing at least one attribute for said first topology graph node to at least one attribute of said second topology graph node to obtain a confidence level for said topology graph node pair;

comparing said confidence level for said topology graph node pair to a confidence threshold;

if said confidence level for said topology graph node pair exceeds said confidence threshold, identifying said topology graph node pair as a matching topology graph node pair and comparing said confidence level for said topology graph node pair to a best confidence level; and if said confidence level for said topology graph node pair exceeds said best confidence level, setting a best matching topology graph node pair to said matching topology graph node pair and setting said best confidence level to said confidence level.

6. A machine-accessible medium as in claim 4, wherein said comparing further comprises determining an additional matching topology graph node pair from said first topology graph and said second topology graph based on traversing said first and second topology graphs from said best matching topology graph node pair.

7. A machine-accessible medium as in claim 6, wherein said determining said additional matching topology graph node pair comprises:

selecting a first topology graph node from said first topology graph connected to a first topology graph node of said best matching topology graph node pair to obtain a selected first topology graph node;

selecting a second topology graph node from said second topology graph connected to a second topology graph node of said best matching topology graph node pair to obtain a selected second topology graph node;

comparing at least one attribute for said selected first topology graph node to at least one attribute of said selected second topology graph node to obtain a confidence level;

comparing said confidence level to a confidence threshold;

if said confidence level said topology graph node pair exceeds said confidence threshold, identifying said selected first topology graph node and said selected second topology graph node as said additional matching topology graph node pair.

8. A machine-accessible medium as in claim 1, wherein said comparison result comprises unmatched topology graph nodes, unmatched line lengths, and unmatched line widths from said first topology graph, and unmatched topology graph nodes, unmatched line lengths, and unmatched line widths from said second topology graph.

9. A method comprising:

obtaining a first circuit layout design;

obtaining a second circuit layout design;

generating a first topology graph for said first circuit layout design;

generating a second topology graph for said second circuit layout design;

comparing said first topology graph and said second topology graph to obtain a comparison result, wherein said comparison result comprises at least a first matched topology graph node pair and a second matched topology graph node pair connected via a topology graph line pair, said topology graph line pair having a pair of lengths and a pair of widths, wherein said method further comprises:

comparing said pair of lengths to a length sensitivity parameter; and comparing said pair of widths to a width sensitivity parameter; and reporting said comparison result.

10. A method as in claim 9, wherein said first topology graph comprises a plurality of first topology graph nodes and a plurality of first topology graph lines, and wherein said second topology graph comprises a plurality of second topology graph nodes and a plurality of second topology graph lines.

11. A method as in claim 10, wherein each first topology graph node comprises a data structure identifying at least one selected from the group consisting of: a node type for the first topology graph node, a node function for the first topology graph node, a node location for the first topology graph node, first topology graph lines connected to the first topology graph node, and at least one layer for the first topology graph, wherein each first topology graph line comprises a data structure identifying at least one selected from the group consisting of: a line type for the first topology graph line, a line location for the first topology graph line, a head node for the first topology graph line, a tail node for the first topology graph line, a layer for the first topology graph line, a line length for the first topology graph line, and a line width for the first topology graph line, wherein each second topology graph node comprises a data structure identifying at least one selected from the group consisting of: a node type for the second topology graph node, a node function for the second topology graph node, a node location for the second topology graph node, second topology graph lines connected to the second topology graph node, and at least one layer for the second topology graph, and wherein each second topology graph line comprises a data structure identifying at least one selected from the group consisting of: a line type for the second topology graph line, a line location for the second topology graph line, a head node for the second topology graph line, a tail node for the second topology graph line, a layer for the second topology graph line, a line length for the second topology graph line, and a line width for the second topology graph line.

12. A method as in claim 9, wherein said comparing comprises determining a best matching topology graph node pair from said first topology graph and said second topology graph.

13. A method as in claim 12, wherein said determining said best matching topology graph node pair comprises:
selecting a first topology graph node from said first topology graph and a second topology graph node from said second topology graph to obtain a topology graph node pair;
comparing at least one attribute for said first topology graph node to at least one attribute of said second topology graph node to obtain a confidence level for said topology graph node pair;
comparing said confidence level for said topology graph node pair to a confidence threshold;
if said confidence level for said topology graph node pair exceeds said confidence threshold, identifying said topology graph node pair as a matching topology graph node pair and comparing said confidence level for said topology graph node pair to a best confidence level; and
if said confidence level for said topology graph node pair exceeds said best confidence level, setting a best matching topology graph node pair to said matching topology graph node pair and setting said best confidence level to said confidence level.

14. A method as in claim 12, wherein said comparing further comprises determining an additional matching topology graph node pair from said first topology graph and said second topology graph based on traversing said first and second topology graphs from said best matching topology graph node pair.

15. A method as in claim 14, wherein said determining said additional matching topology graph node pair comprises:
selecting a first topology graph node from said first topology graph connected to a first topology graph node of said best matching topology graph node pair to obtain a selected first topology graph node;
selecting a second topology graph node from said second topology graph connected to a second topology graph node of said best matching topology graph node pair to obtain a selected second topology graph node;
comparing at least one attribute for said selected first topology graph node to at least one attribute of said selected second topology graph node to obtain a confidence level;
comparing said confidence level to a confidence threshold;
if said confidence level said topology graph node pair exceeds said confidence threshold, identifying said selected first topology graph node and said selected second topology graph node as said additional matching topology graph node pair.

16. A method as in claim 9, wherein said comparison result comprises unmatched topology graph nodes, unmatched line lengths, and unmatched line widths from said first topology graph, and unmatched topology graph nodes, unmatched line lengths, and unmatched line widths from said second topology graph.

17. An apparatus comprising at least one processor and at least one machine-accessible medium coupled to said at least one processor, said at least one processor adapted to perform operations comprising a method of:
obtaining a first circuit layout design;
obtaining a second circuit layout design;
generating a first topology graph for said first circuit layout design;
generating a second topology graph for said second circuit layout design;
comparing said first topology graph and said second topology graph to obtain a comparison result, wherein said comparison result comprises at least a first matched topology graph node pair and a second matched topology graph node pair connected via a topology graph line pair, said topology graph line pair having a pair of lengths and a pair of widths, wherein said method further comprises:
comparing said pair of lengths to a length sensitivity parameter; and
comparing said pair of widths to a width sensitivity parameter; and reporting said comparison result.

18. An apparatus as in claim 17, wherein said first topology graph comprises a plurality of first topology graph nodes and a plurality of first topology graph lines, and wherein said second topology graph comprises a plurality of second topology graph nodes and a plurality of second topology graph lines.

19. An apparatus as in claim 18, wherein each first topology graph node comprises a data structure identifying at least one selected from the group consisting of: a node type for the first topology graph node, a node function for the first topology graph node, a node location for the first topology graph node, first topology graph lines connected to the first topology graph node, and at least one layer for the first topology graph,
wherein each first topology graph line comprises a data structure identifying at least one selected from the group consisting of: a line type for the first topology graph line, a line location for the first topology graph line, a head node for the first topology graph line, a tail node for the first topology graph line, a layer for the first topology graph line, a line length for the first topology graph line, and a line width for the first topology graph line,
wherein each second topology graph node comprises a data structure identifying at least one selected from the group consisting of: a node type for the second topology graph node, a node function for the second topology graph node, a node location for the second topology graph node, second topology graph lines connected to the second topology graph node, and at least one layer for the second topology graph, and
wherein each second topology graph line comprises a data structure identifying at least one selected from the group consisting of: a line type for the second topology graph line, a line location for the second topology graph line, a head node for the second topology graph line, a tail node for the second topology graph line, a layer for the second topology graph line, a line length for the second topology graph line, and a line width for the second topology graph line.

20. An apparatus as in claim 17, wherein said comparing comprises determining a best matching topology graph node pair from said first topology graph and said second topology graph.

21. An apparatus as in claim 20, wherein said determining said best matching topology graph node pair comprises:
selecting a first topology graph node from said first topology graph and a second topology graph node from said second topology graph to obtain a topology graph node pair;

comparing at least one attribute for said first topology graph node to at least one attribute of said second topology graph node to obtain a confidence level for said topology graph node pair;

comparing said confidence level for said topology graph node pair to a confidence threshold;

if said confidence level for said topology graph node pair exceeds said confidence threshold, identifying said topology graph node pair as a matching topology graph node pair and comparing said confidence level for said topology graph node pair to a best confidence level; and if said confidence level for said topology graph node pair exceeds said best confidence level, setting a best matching topology graph node pair to said matching topology graph node pair and setting said best confidence level to said confidence level.

22. An apparatus as in claim 20, wherein said comparing further comprises determining an additional matching topology graph node pair from said first topology graph and said second topology graph based on traversing said first and second topology graphs from said best matching topology graph node pair.

23. An apparatus as in claim 22, wherein said determining said additional matching topology graph node pair comprises:

selecting a first topology graph node from said first topology graph connected to a first topology graph node of said best matching topology graph node pair to obtain a selected first topology graph node;

selecting a second topology graph node from said second topology graph connected to a second topology graph node of said best matching topology graph node pair to obtain a selected second topology graph node;

comparing at least one attribute for said selected first topology graph node to at least one attribute of said selected second topology graph node to obtain a confidence level;

comparing said confidence level to a confidence threshold;

if said confidence level said topology graph node pair exceeds said confidence threshold, identifying said selected first topology graph node and said selected second topology graph node as said additional matching topology graph node pair.

24. An apparatus as in claim 17, wherein said comparison result comprises unmatched topology graph nodes, unmatched line lengths, and unmatched line widths from said first topology graph, and unmatched topology graph nodes, unmatched line lengths, and unmatched line widths from said second topology graph.

25. An apparatus comprising:

a topology graph generator to produce a first topology graph from a first circuit layout design and to produce a second topology graph from a second circuit layout design; and a comparator coupled to said topology graph generator, said comparator to receive said first topology graph and said second topology graph from said topology graph generator, said comparator to compare said first topology graph and said second topology graph to obtain a comparison result, wherein said comparison result comprises at least a first matched topology graph node pair and a second matched topology graph node pair connected via a topology graph line pair, said topology graph line pair having a pair of lengths and a pair of widths, wherein said comparator further:

compares said pair of lengths to a length sensitivity parameter; and compares said pair of widths to a width sensitivity parameter.

26. An apparatus as in claim 25, wherein said first topology graph comprises a plurality of first topology graph nodes and a plurality of first topology graph lines, and wherein said second topology graph comprises a plurality of second topology graph nodes and a plurality of second topology graph lines.

27. An apparatus as in claim 26, wherein each first topology graph node comprises a data structure identifying at least one selected from the group consisting of: a node type for the first topology graph node, a node function for the first topology graph node, a node location for the first topology graph node, first topology graph lines connected to the first topology graph node, and at least one layer for the first topology graph, wherein each first topology graph line comprises a data structure identifying at least one selected from the group consisting of: a line type for the first topology graph line, a line location for the first topology graph line, a head node for the first topology graph line, a tail node for the first topology graph line, a layer for the first topology graph line, a line length for the first topology graph line, and a line width for the first topology graph line, wherein each second topology graph node comprises a data structure identifying at least one selected from the group consisting of: a node type for the second topology graph node, a node function for the second topology graph node, a node location for the second topology graph node, second topology graph lines connected to the second topology graph node, and at least one layer for the second topology graph, and wherein each second topology graph line comprises a data structure identifying at least one selected from the group consisting of: a line type for the second topology graph line, a line location for the second topology graph line, a head node for the second topology graph line, a tail node for the second topology graph line, a layer for the second topology graph line, a line length for the second topology graph line, and a line width for the second topology graph line.

28. An apparatus as in claim 25, wherein said comparator determines a best matching topology graph node pair from said first topology graph and said second topology graph.

29. An apparatus as in claim 28, wherein to determine said best matching topology graph node pair, said comparator:

selects a first topology graph node from said first topology graph and a second topology graph node from said second topology graph to obtain a topology graph node pair;

compares at least one attribute for said first topology graph node to at least one attribute of said second topology graph node to obtain a confidence level for said topology graph node pair;

compares said confidence level for said topology graph node pair to a confidence threshold;

if said confidence level for said topology graph node pair exceeds said confidence threshold, identifies said topology graph node pair as a matching topology graph node pair and comparing said confidence level for said topology graph node pair to a best confidence level; and if said confidence level for said topology graph node pair exceeds said best confidence level, sets a best matching topology graph node pair to said matching topology graph node pair and setting said best confidence level to said confidence level.

30. An apparatus as in claim 28, wherein said comparator further determines an additional matching topology graph node pair from said first topology graph and said second topology graph based on traversing said first and second topology graphs from said best matching topology graph node pair.

31. An apparatus as in claim 30, wherein to determine said additional matching topology graph node pair, said comparator:

selects a first topology graph node from said first topology graph connected to a first topology graph node of said best matching topology graph node pair to obtain a selected first topology graph node;

selects a second topology graph node from said second topology graph connected to a second topology graph node of said best matching topology graph node pair to obtain a selected second topology graph node;

compares at least one attribute for said selected first topology graph node to at least one attribute of said selected second topology graph node to obtain a confidence level;

compares said confidence level to a confidence threshold;

if said confidence level said topology graph node pair exceeds said confidence threshold, identifies said selected first topology graph node and said selected second topology graph node as said additional matching topology graph node pair.

32. An apparatus as in claim 25, wherein said comparison result comprises unmatched topology graph nodes, unmatched line lengths, and unmatched line widths from said first topology graph, and unmatched topology graph nodes, unmatched line lengths, and unmatched line widths from said second topology graph.

* * * * *